United States Patent
Hesener (10) Patent No.: US 8,810,293 B2
(45) Date of Patent: Aug. 19, 2014

(54) PULSED GATE DRIVER

(71) Applicant: Fairchild Semiconductor Corporation, San Jose, CA (US)

(72) Inventor: Alfred Hesener, Munich (DE)

(73) Assignee: Fairchild Semiconductor Corporation, San Jose, CA (US)

(*) Notice: Subject to any disclaimer, the term of this patent is extended or adjusted under 35 U.S.C. 154(b) by 0 days.

(21) Appl. No.: 13/961,059

(22) Filed: Aug. 7, 2013

(65) Prior Publication Data

US 2014/0043076 A1 Feb. 13, 2014

(30) Foreign Application Priority Data

Aug. 8, 2012 (DE) .......................... 10 2012 015 787

(51) Int. Cl.
*H03K 5/156* (2006.01)

(52) U.S. Cl.
USPC ............ 327/170; 327/108; 327/175; 327/389

(58) Field of Classification Search
USPC ............. 327/108, 110, 170–176, 31, 36, 389, 327/398
See application file for complete search history.

(56) References Cited

U.S. PATENT DOCUMENTS

| | | |
|---|---|---|
| 5,559,656 A | 9/1996 | Chokhawala |
| 5,689,394 A | 11/1997 | Esser et al. |
| 6,275,093 B1 | 8/2001 | Shekhawat et al. |
| 6,326,819 B1 | 12/2001 | Carlson |
| 6,341,073 B1 * | 1/2002 | Lee ............................ 363/21.02 |
| 2007/0200613 A1 | 8/2007 | Ishikawa et al. |
| 2008/0012622 A1 | 1/2008 | Khasiev et al. |
| 2008/0129263 A1 * | 6/2008 | Kotikalapoodi et al. ..... 323/283 |
| 2008/0290911 A1 | 11/2008 | Williams |

FOREIGN PATENT DOCUMENTS

DE 202010015965 4/2011
GB 2440771 2/2008

* cited by examiner

*Primary Examiner* — An Luu
(74) *Attorney, Agent, or Firm* — Grossman Tucker Perreault & Pfleger PLLC (57) ABSTRACT

A gate driver includes a control input receiving a control signal, an output to provide an amplified output signal to the gate, and controller. The controller produces an adaptive pulse train varying with the control signal. An adaptive incrementer produces a sequence of numbers that set a slew rate of the switch, and a look-up table is fed with the sequence of numbers, and associates the numbers produced by the adaptive incrementer with values representing the duty cycle of the output signal to control the slew rate of the switch. The switch can be driven at various intermediate levels, and allows gate drive conditions to adapted to abnormal system states by varying the control input signal. The adaptive response allows the slew rate to vary without replacing any gate driver circuit components. Because the gate current is provided adaptively, the delivery of gate current results in low power dissipation.

21 Claims, 6 Drawing Sheets

PULSED GATE DRIVER

CROSS-REFERENCE TO RELATED APPLICATION

This application claims priority to German Patent Application No. 10 2012 015 787.8, filed Aug. 8, 2012 in the German Patent and Trademark Office, the entirety of which is incorporated herein by reference.

TECHNICAL FIELD

The device and system described herein relate to pulsed gate drivers for driving the gate of a switch, particularly a switch used in high power applications.

BACKGROUND

Gate drivers are used to drive switches used in high power applications, such as power MOSFETs, IGBTs, and bipolar transistors (BJTs).

A gate driver is basically a power amplifier that accepts a low-power input from a controller integrated circuit, and produces an appropriate high-power gate drive for a power switch.

Patent document U.S. Pat. No. 6,326,819 B1 discloses such a gate driver, which uses a current buffer comprising two switches to control the flow of electrical current to the gate of an IGBT from a positive and a negative power source, respectively. A control circuit is provided to control the switches between an ON and an OFF state.

Patent document U.S. Pat. No. 6,275,093 B1 discloses an IGBT gate driver circuit, which includes means for detecting when the collector-to-emitter voltage of a turned-on IGBT increases above a preset level, thus indicating a fault condition such as a short circuit. An analog circuit is provided which is adapted to sense such an increase in the collector-to-emitter voltage, and to respond by turning the IGBT off in two steps. First, the gate voltage is decreased to a level that is still above the threshold (turned-on) voltage of the IGBT, in order to decrease the current flowing through the IGBT. Then, the gate voltage is gradually decreased until the IGBT is completely turned off.

A similar circuit is disclosed in patent document U.S. Pat. No. 5,559,656, which describes a gate driver circuit for preventing switching voltage transients from damaging an IGBT during a shut off operation performed in response to a short circuit. Analog circuitry is disclosed which is adapted to decrease the rate of fall of gate voltage of the IGBT when a short circuit condition is sensed.

Patent application publication US 2008/0290911 A1 discloses a gate driver which is adapted to switch a power MOSFET between a fully-on condition and a low-current condition, instead of switching the MOSFET between fully-on and fully-off conditions. A feedback circuit may be used to ensure that the magnitude of current in the power MOSFET in its low-current condition is correct.

Patent application publication US 2007/0200613 A1 discloses a gate driver which includes: a drive circuit that applies a drive signal to the gate electrode of a power semiconductor switching device; and a measurement unit for measuring a flow current of the power semiconductor switching device. The drive circuit is adapted to adjust the gate voltage based on a detected value of the current flowing through the power semiconductor switching device.

Finally, patent application publication US 2008/0012622 A1 discloses a gate driver for a power switch, which can turn on and turn off the power switch by controlling the gate voltage of the switch. In particular, in a first period, the gate voltage of the switch can be driven to a first level, to cause the switch to close. In a second period, the gate voltage of the switch is disconnected from the voltage source, but the gate voltage remains sufficiently high for the switch to remain closed. In a third period, the gate of the switch is connected to ground, thus pulling the gate voltage low and causing the switch to open. The gate driver comprises driver logic, which may include a pulse width generator programmer and a pulse width generator. The pulse width generator causes the first, second and third periods described above to be repeated in succession, thus repeatedly closing and opening the switch at intervals inversely related to the frequency of the pulse. The gate driver may further include a feedback loop, coupled to the driver logic, so as to adjust the length of the period during which the switch is opened or closed.

Document U.S. Pat. No. 5,689,394 A describes gate voltage modulation for transistor fault conditions. The controller is capable of providing a command signal to the gate driver and pulse width modulating the command signal upon receiving a comparator signal from the gate driver to gradually switch off the power device. In one embodiment, the controller comprises a logic device such as a logic gate array which is capable of sending on/off switching signals, and a command signal is sent during the "on" intervals. In the event that the voltage between the outputs of the power device approaches a saturation level during a command signal interval, the controller includes a pulse width modulator which can modulate the command signal sent to the gate driver. The voltage can be controlled by selecting the appropriate pulse width modulation for the on/off switching of the voltage to gate driver.

A driver for a power semiconductor switch is disclosed in document DE 20 2010 015 965 U1. The driver comprises a switching output for coupling of a switching input of a power semiconductor switch. Moreover, the driver comprises a logics input for a logical switching signal as well as a converter converting the logic switch signal into a power signal. The power signal is a pulse-width modulated signal with a presettable duty cycle, and it is supplied to the switching output starting from the converter via an inductivity. Thereby, the duty cycle of the power signal can be changeable. By varying the duty cycle during the switching event, a specific loading/unloading curve can be set for the respectively coupled power semiconductor or even for individual switching events. Optionally, the converter may comprise a memory in which the duty cycle or various values therefor are storable. The memory is programmable so that, for example, after delivery of the driver to a customer, arbitrarily adjustable or programmable duty cycles can be programmed by the customer. Fixed duty cycles are thereby preset, which may optionally be switched.

The gate drivers which are known from the prior art have several limitations or disadvantages. The slew rate (also sometimes referred to as the "turn-on speed" or "turn-off speed") of the switch cannot be adaptively changed during operation. This means that no adaptive timing of the switch is possible.

Many known gate drivers rely on resistor networks in order to control the delivery of gate current, which leads to large power dissipation during delivery of gate current.

Such drivers cannot be easily adapted to control the gate current or base current of the switch in response to changed parameters (temperature; load variation; abnormal operating conditions) or in case of abnormal system states (e.g. short circuits).

Moreover, flexible setting of a particular slew rate of the switch or the efficient implementation of a virtually unlimited number of slew patterns is not enabled by means described in the prior art.

SUMMARY

A gate driver is disclosed which addresses at least one of the problems of the prior art described above. Furthermore, a system for switching a high-power load is disclosed which addresses at least one of the problems of the prior art described above.

According to a first aspect, a gate driver for driving a gate of a switch is provided. The gate driver comprises a control input which is adapted to receive a control signal, and an output which is adapted to provide an amplified output signal to be fed to the gate of the switch for driving the switch. The gate driver further comprises a controller connected between the control input and the output, wherein the controller is adapted to produce an adaptive pulse train that varies depending on a characteristic of the control signal.

This allows the gate driver of the first aspect to drive the switch not only in certain predefined states, including ON or OFF, but also to implement proportional drive of the switch at various intermediate levels. Furthermore, because the gate current depends on the adaptive pulse train produced by the controller, the delivery of gate current results in relatively low power dissipation. Moreover, the gate driver of the first aspect can be easily adapted to change gate drive conditions in case of abnormal system states by adapting the control input signal.

According to the first aspect, the controller of the gate driver may be adapted to vary the adaptive pulse train according to the characteristic of the control signal so as to adjust a slew rate of the switch. This allows the slew rate of the switch to be varied without the need to replace any of the circuit components which form the gate driver. With this feature, it is possible to implement a virtually unlimited number of slew patterns, each slew pattern corresponding to a particular control signal, thus enabling fully adaptive timing of the switch.

The gate driver of the first aspect may further comprise a feedback input which is adapted to receive a feedback signal. In this case, the controller receives the feedback signal and varies the adaptive pulse train depending at least in part on a characteristic of the feedback signal. The controller may be adapted to vary the adaptive pulse train according to a characteristic of the feedback signal so as to control saturation of the switch or so as to enable proportional drive of the switch. In case the feedback signal represents a temperature of the switch, the controller may be adapted to vary the adaptive pulse train according to the temperature of the switch so as to turn off the switch in case of overcurrent.

According to the first aspect, the controller may be adapted to vary the adaptive pulse train by adapting a duty cycle of the pulse train or by adapting a number of pulses in the pulse train. As such, the adaptive control of the switch can be implemented by varying the pulse train, without the need to alter or replace any analog circuit components.

According to the first aspect, the controller may comprise an adaptive pulse generator. The gate driver of the first aspect may further comprise an amplifier. In case an adaptive pulse generator and/or an amplifier is provided, these components may be provided in any sequence relative to each other. Specifically, the controller may be adapted to produce a non-amplified pulse train, in which case the amplifier receives the non-amplified pulse train and produces the amplified output signal. Alternatively, the amplifier may be adapted to produce an amplified signal, in which case the controller receives the amplified signal and produces the adaptive pulse train which forms the amplified output signal.

According to a second aspect, a system for switching a high-power load is provided. The system comprises: a switch which comprises a gate, a first terminal connected to the high-power load, and a second terminal; and a gate driver for driving the gate of the switch. The gate driver is the same gate driver described above as the first aspect.

This system allows the switch to be driven not only in certain predefined states, such as ON or OFF, but to be driven at various intermediate levels (proportional drive). Furthermore, because the gate current is provided adaptively according to the pulse train produced by the controller, the delivery of gate current results in relatively low power dissipation. Moreover, this system can be easily adapted to change gate drive conditions in case of abnormal system states by varying the control input signal. The adaptive response to the control input signal also allows the slew rate of the switch to be varied without the need to replace any of the circuit components which form the gate driver. It is therefore possible to implement a virtually unlimited number of slew patterns, each slew pattern corresponding to a particular control signal, thus enabling fully adaptive timing of the switch.

According to the second aspect, the switch may be adapted to conduct a gate current from the first terminal to the second terminal in response to the output signal of the gate driver, and in this case the feedback signal may represent the gate current of the switch. In particular, the system may further comprise a current sensor adapted to provide a measurement of the gate current of the switch as the feedback signal. This allows proportional drive of the switch to be implemented, particularly if the switch is a bipolar transistor (BJT). This feature also allows overcurrent to be detected, so that the gate driver can safely turn the switch off before the overcurrent results in damage to the circuit.

Alternatively, according to the second aspect, the feedback signal may represent a temperature of the switch. In this case, the system may comprise a temperature sensor adapted to provide a measurement of temperature of the switch as the feedback signal. This feature allows overcurrent to be detected, so that the gate driver can safely turn the switch off before the overcurrent results in damage to the circuit.

In another alternative, according to the second aspect, the feedback signal may represent a voltage at the second terminal of the switch, a voltage at the gate of the switch, or a ratio of a voltage at the first terminal to a voltage at the second terminal of the switch. This allows various slew rates of the switch to be implemented. It also allows proportional drive to be realized, particularly if the switch is a bipolar transistor (BJT). Furthermore, this feature allows overcurrent to be detected, so that the gate driver can safely turn the switch off before the overcurrent results in damage to the circuit.

In any of the above aspects, inductances which are present in the gate drive loop can be used to control and shape the current flowing through the gate of the switch. Specifically, if the switch is a MOSFET, then the pulses produced by the gate driver at its output are integrated by the gate capacitance of the MOSFET. If the switch is a bipolar transistor, an inductor may be placed in the base path of the transistor so as to smooth the base current.

According to any of the above aspects, the switch may be a metal-oxide semiconductor field-effect transistor (MOSFET) or power MOSFET, an insulated-gate bipolar transistor (IGBT), a bipolar junction transistor (BJT) which may also simply be referred to as a bipolar transistor, a silicon controlled rectifier (SCR) alternatively referred to as a thyristor, a gate turn-off thyristor (GTO), an integrated gate-commutated thyristor (IGCT), or any other semiconductor power switch which is controlled with a voltage or current which is small compared to the main current in the power switch.

BRIEF DESCRIPTION OF THE DRAWINGS

Preferred embodiments will now be described with reference to the accompanying drawings, in which.

DETAILED DESCRIPTION

Figure 1:
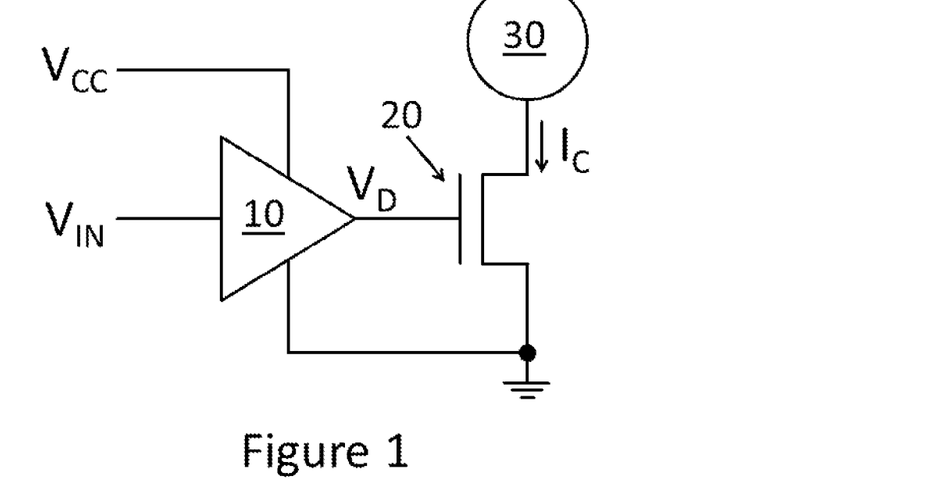
FIG. 1 is a schematic diagram of a system for switching a high-power load.

FIG. 1 shows a system for switching a high-power load 30. The load 30 is switched via switch 20, which conducts a load current $I_C$. Switch 20 can also be referred to as a switching element or a power switch. A first terminal of switch 20 is connected to the load 30, and a second terminal of switch 20 is connected to ground. The gate of switch 20 is driven by a gate driver 10, which receives a control signal $V_{IN}$ from an external controller and produces an amplified output signal $V_D$. The gate driver 10 is also connected to a power source $V_{CC}$ and to ground.

Figure 2:
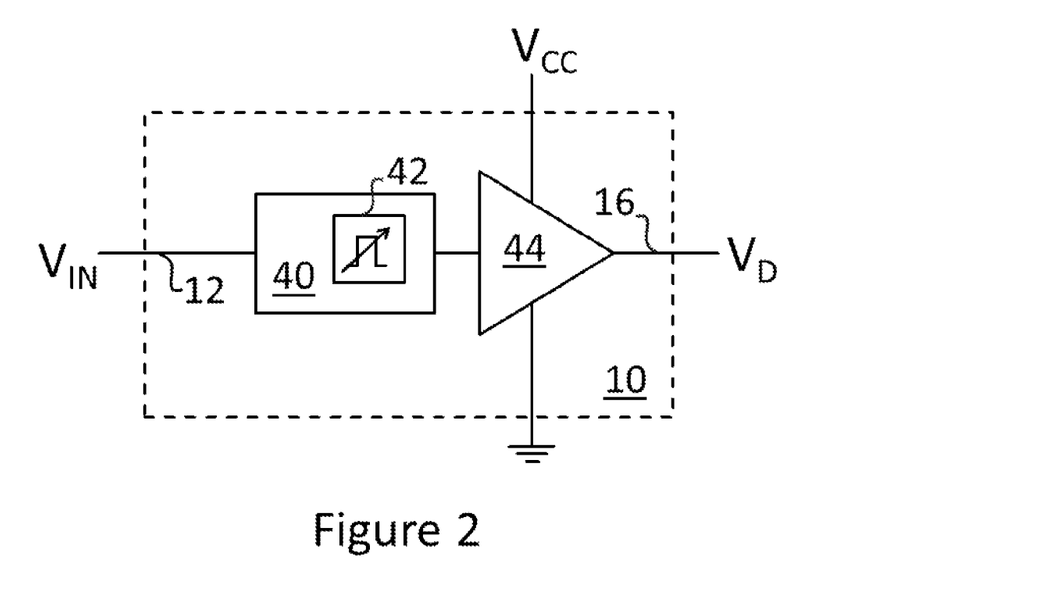
FIG. 2 is a schematic diagram of a gate driver according to a first embodiment.

FIG. 2 shows a first embodiment of the gate driver 10 illustrated in FIG. 1. Gate driver 10 comprises a control input 12 which receives the control signal $V_{IN}$. The control signal $V_{IN}$ is fed to a controller 40, which produces a pulse train that varies depending on a characteristic of the control signal $V_{IN}$. The controller 40 may digitally process the control signal $V_{IN}$, or the controller 40 may be adapted to process analogue information in the control signal $V_{IN}$.

In either case, the controller 40 comprises an adaptive pulse generator 42, which adaptively generates a high-frequency pulse train based on the control signal $V_{IN}$. Specifically, the high-frequency pulse train generated by the adaptive pulse generator 42 comprises a sequence of individual pulses.

Depending on control signal $V_{IN}$, the duty cycle of the individual pulses of the high-frequency pulse train may vary from 0% to 100%. If the duty cycle is 0%, the pulse train is equivalent to a "low" voltage. If the duty cycle is 100%, the pulse train is equivalent to a constant, high voltage. For a duty cycle anywhere between 0% and 100%, the individual pulses which form a pulse train have a pulse width, alternatively referred to as a duration, in which the signal is high for a portion of each period corresponding to the duty cycle expressed as a fraction of that period.

The individual pulses within a single pulse train produced by the adaptive pulse generator 42 may all have the same pulse width; alternatively, the duration of the pulses within a single pulse train may vary. Moreover, the number of pulses within a pulse train produced by the adaptive pulse generator 42 may be varied depending on control signal $V_{IN}$, so as to allow finer control of the power switch 20. Such finer control may include, for example, adjusting slew rate of switch 20, or defining variations in switching speed, so as to improve system robustness and reduce electromagnetic interference (EMI).

The output of the controller 40 is connected to an amplifier 44, which receives the adaptive high-frequency pulse train, produces an amplified output signal $V_D$ and feeds it to an output 16 of the gate driver 10. The amplifier 44 shown in FIG. 2 is connected to $V_{CC}$ and ground; however, a bipolar voltage supply (comprising a positive terminal V+ and a negative terminal V−) is also possible.

Figure 3:
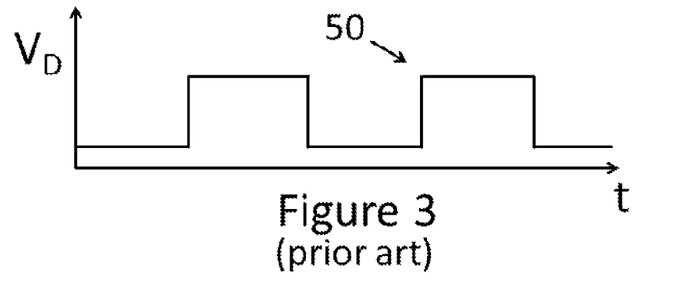
FIG. 3 is a timing diagram of an output signal of a gate driver according to the prior art.

As shown in FIG. 3, gate drivers according to the prior art provide an amplified output signal $V_D$ consisting of a single pulse, or square wave 50. When the output signal $V_D$ is high, the switch 20 is turned on, such that a load current $I_C$ flows through the switch 20. When the output signal $V_D$ is low, the switch 20 is turned off, such that no current flows through the switch 20.

Figure 4:
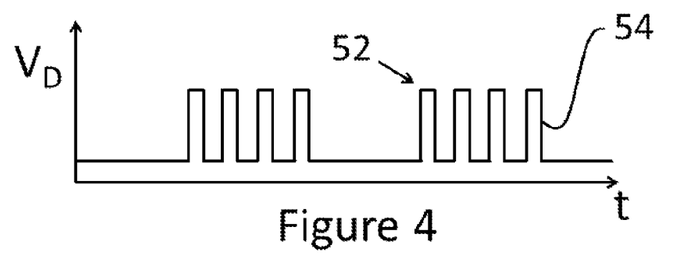
FIG. 4 is a timing diagram of an output signal of the gate driver of the first embodiment.

FIG. 4 shows one example of an amplified output signal $V_D$ produced by a gate driver provided herein. The amplified output signal $V_D$ comprises an adaptive pulse train 52, which comprises a sequence of at least two individual pulses 54. Based on the pulse train produced by the adaptive pulse generator 42, the amplified output signal $V_D$ may contain a variable number of pulses 54; alternatively, the pulses 54 may have a varying duty cycle depending on control signal $V_{IN}$.

Figure 5:
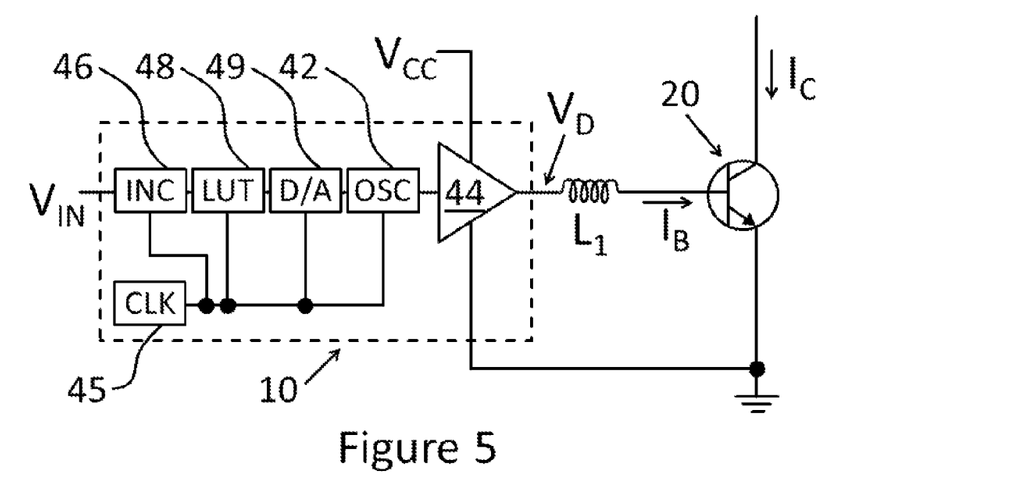
FIG. 5 is a schematic diagram of a possible implementation of the system shown in FIG. 1 incorporating a bipolar transistor as a switch.

FIG. 5 shows one possible implementation of the system shown in FIG. 1, incorporating a bipolar transistor as a switch 20. However, a similar system could be implemented with a MOSFET as switch 20 instead of a bipolar transistor.

As shown in FIG. 5, if the switch 20 is a bipolar transistor, an inductor $L_1$ can be provided in the base path of the bipolar transistor 20 to smooth the base current $I_B$ provided by amplified output signal $V_D$. Such an inductor $L_1$ can ensure proper operation, and/or can provide immunity from component and layout variations. In case the switch 20 is a MOSFET, such an inductor is not necessary; however, parasitic inductances may be present in the gate path anyway.

In the system shown in FIG. 5, the gate driver 10 comprises a clock CLK 45, an adaptive incrementer INC 46, a look-up table LUT 48, and a voltage-controlled oscillator OSC 42. Optionally, the gate driver 10 may further comprise a digital-to-analog-converter D/A 49.

The clock signal CLK 45 can be inputted from an external timing device, or can be provided as a module within controller 10. In either case, the clock signal produces a pulse at a frequency equivalent to the desired frequency of voltage-controlled oscillator OSC 42, or at a multiple of that frequency.

When the control signal $V_{IN}$ goes high, the adaptive incrementer INC 46 produces a sequence of numbers, at intervals equal to the period of voltage-controlled oscillator OSC 42. The values produced by the adaptive incrementer INC 46 allow a particular slew rate of switch 20 to be set. For example, if it is desired to turn on the switch 20 over a period of two oscillations of the voltage-controlled oscillator OSC 42, then to hold the switch 20 in an on state, and then to immediately turn off the switch 20 in response to the control signal $V_{IN}$ going low, the adaptive incrementer INC 46 could produce the sequence of numbers shown in Table 1.

TABLE 1

Values of INC to produce an exemplary desired slew-rate

| Clock pulse interval | 0 | 1 | 2 | 3 | 4 | ... | n | n + 1 |
|---|---|---|---|---|---|---|---|---|
| $V_{IN}$ | 0 | 1 | 1 | 1 | 1 | 1 | 1 | 0 |
| INC | 0 | 1 | 2 | 3 | 3 | 3 | 3 | 0 |

In the example shown in Table 1, when the control signal $V_{IN}$ goes high, the adaptive incrementer starts incrementing its output at each clock pulse interval, until the number is reached at which the switch 20 should be held in a steady-state ON state (in this example, 3). From then on, the adaptive incrementer ceases to increment, but rather repeats the same output value (in this example, 3), which is used to designate a steady-state ON state. When the control signal $V_{IN}$ goes low, the output of adaptive incrementer INC 46 returns to zero.

More generally, if it is desired to control the slew rate of switch 20 so as to turn on the switch 20 over a period of one, three, four, five, or more oscillations of the voltage-controlled oscillator OSC 42, then the adaptive incrementer INC 46 can be designed so as to pause its output after the desired number of increments. Furthermore, if it is desired to control the turn-off slew rate of switch 20, then the adaptive incrementer INC 46 can be designed to increment further in response to the control signal $V_{IN}$ going low, for the number of periods over which switch 20 is to be turned off.

The signal produced by the adaptive incrementer INC 46 is fed to look-up table LUT 48, which produces a value that is converted to an analog signal by digital-to-analog (D/A) converter 49, and input to voltage-controlled oscillator OSC 42. The look-up table LUT 48 associates the numbers produced by adaptive incrementer INC 46 with values (indirectly) representing the duty cycle of output signal $V_D$, so as to control the slew rate of the switch 20. Taking the example shown in FIG. 1, a corresponding look-up table LUT 48 could associate input and output values as shown in Table 2.

TABLE 2

Exemplary look-up table LUT 48

| LUT input | 1 | 2 | 3 |
|---|---|---|---|
| LUT output | 4 | 4 | 2 |

Based on the value output by look-up table LUT 48, voltage-controlled oscillator OSC 42 produces a pulse with a period determined by CLK 45 and with a duty cycle determined by the amplitude of the signal from the D/A converter 49.

Although the oscillator OSC 42 in the example shown in FIG. 5 is described as a voltage-controlled oscillator, any other type of adaptive pulse generator, such as a pulse-width modulator, may be used as oscillator OSC 42. In implementations which comprise an oscillator that is adapted to accept a digital input, the D/A converter 49 may be omitted.

Table 3 illustrates one example of a relationship between the output values of the look-up table LUT 48 and the duty cycle of the pulse output by oscillator OSC 42.

TABLE 3

Exemplary relation between LUT and OSC values

| LUT output | 0 | 1 | 2 | 3 | 4 | 5 |
|---|---|---|---|---|---|---|
| OSC output duty cycle | 0% | 20% | 40% | 60% | 80% | 100% |

In the example shown in Table 3, the look-up table output values 0 to 5 are proportional to an oscillator OSC duty cycle between 0% and 100%, respectively. However, the look-up table LUT 48 may be designed to output fewer or more than six values, depending on how fine the gradation of the duty cycle of the oscillator OSC is required. Furthermore, the look-up table LUT 48 output values need not span all oscillator OSC outputs from 0% to 100% duty cycle, but could span any sub-range of OSC values, such as a range of 10% to 100%, a range of 0% to 85%, or a range of 3% to 68%.

The adaptive incrementer INC 46 and look-up table LUT 48 are preferably implemented digitally, either separately or as a combined component. They are further preferably implemented in such a way as to be programmable, so that the turn-on slew rate and turn-off slew rate of switch 20 can be adjusted by reprogramming the values produced by adaptive incrementer INC 46 and look-up table LUT 48.

More particularly, in one implementation, the adaptive incrementer INC 46 and the look-up table LUT 48 can be connected to a memory stored inside control unit 10 or external to control unit 10, wherein the memory contains one or more sets of data corresponding to particular types of switches (such as for BJTs, MOSFETs, IGBTs, etc.) or corresponding to certain desired slew-rate patterns for one or more types of switches. In this implementation, the adaptive incrementer INC 46 and the look-up table LUT 48 can be adapted to select and load the appropriate set of data based on a signal input via $V_{IN}$, or based on the position of a manual switch on the gate controller 10, or with the help of I/O modules connected with the gate controller 10. In this way, the adaptive incrementer INC 46 and the look-up table LUT 48 within gate controller 10 can be used to control various types of switches 20 at various, selectable slew rates.

Figure 6:
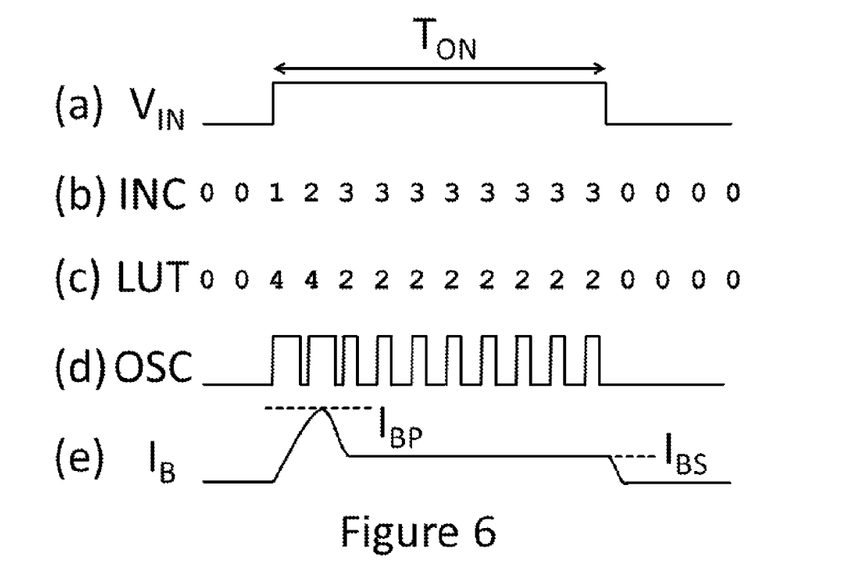
FIG. 6 is a timing diagram corresponding to the system shown in FIG. 5, in which the operation of turning the bipolar transistor on and off is illustrated.

FIG. 6 shows a timing diagram illustrating how bipolar transistor 20 can be driven by the system shown in FIG. 5, in order to achieve a desired turn-on slew rate. The parameters used in this example have been selected only for illustrative purposes, and are in no way to be understood as limiting.

In this example, control signal $V_{IN}$ is held high for a period of 4 μs, which is denoted $T_{ON}$ in FIG. 6(a). Furthermore, the clock frequency is 100 kHz, which leads to the number of pulses in the pulse train being 10. Finally, $V_{CC}$ is 5V, base-emitter voltage $V_{BE}$ is 2.5V, and inductor $L_1$ has an inductance of 3.6 μH.

The peak base current $I_{BP}$ of the transistor 20 and steady-state base current $I_{BS}$ of the transistor 20 are dependent on the type of bipolar transistor used, and can be derived from load current and current gain listed in the transistor specification. In this example, the peak base current $I_{BP}$ is taken to be 0.5 A, and the steady-state base current $I_{BS}$ is taken to be 0.125 A.

The control signal $V_{IN}$, shown in FIG. 6(a), indicates when the bipolar transistor 20 is to be switched on. Assuming that it is desired to reach the peak base current $I_{BP}$ in two pulses (0.8 μs), the gate driver duty cycle $D_{GD}$ can be calculated as follows:

$$(V_{CC} - V_{BE}) = L_1 * I_B / (T_{ON} * 2 * D_{GD})$$

The above formula indicates that the required duty cycle $D_{GD}$ of gate driver 10 is 90%. For the remaining pulses, it is desired to hold the base current $I_B$ at the steady-state base current $I_{BS}$. Again applying the above formula, the required duty cycle $D_{GD}$ of 45% is obtained.

Table 4 provides a summary of the pulse number, the value produced by adaptive incrementer INC 46, the output of look-up table LUT 48, and the duty cycle of each pulse for this example. In this example, adaptive incrementer INC 46 and look-up table LUT 48 function as shown above in Table 1 and Table 2, respectively.

TABLE 4

Values according to example illustrated in FIG. 6

| Pulse | 1 | 2 | 3 | 4 | 5 | 6 | 7 | 8 | 9 | 10 |
|---|---|---|---|---|---|---|---|---|---|---|
| INC | 1 | 2 | 3 | 3 | 3 | 3 | 3 | 3 | 3 | 3 |
| LUT | 4 | 4 | 2 | 2 | 2 | 2 | 2 | 2 | 2 | 2 |
| OSC duty cycle | 90% | 90% | 45% | 45% | 45% | 45% | 45% | 45% | 45% | 45% |

As shown in FIG. 6(b), the adaptive incrementer INC 46 increments up to 3, to allow look-up table values to be defined for the first two start-up oscillation periods, and to allow a separate look-up table value to be defined for the third and further (steady-state) oscillation periods. To achieve the desired slew rate for the first two pulses, the look-up table LUT 48 produces an output of 4, as shown in FIG. 6(c), which corresponds to a 90% duty cycle of the oscillator OSC 42 output, as shown in FIG. 6(d). Consequently, as shown in FIG. 6(e), the base current $I_B$ reaches the peak base current $I_{PB}$ after two pulses, or 0.8 µs.

To achieve the desired base current for the remaining pulses, the look-up table LUT 48 produces an output of 2 as shown in FIG. 6(c), which corresponds to a 45% duty cycle of the oscillator OSC 42 output, as shown in FIG. 6(d). Consequently, as shown in FIG. 6(e), the base current $I_B$ is held at the steady-state base current $I_{BS}$ for the remainder of the period $T_{ON}$.

Although the example shown in FIG. 6 is focused on achieving a particular slew rate when turning the bipolar transistor 20 on, the gate driver 10 can analogously be operated so as to provide an adjustable slew rate when turning the transistor 20 off. Specifically, switching off a power transistor can result in significant peak voltages on the device when parasitic inductance is present in the system. The turn-off speed of transistor 20 can be adjusted so as to avoid such voltage peaks by varying the duty cycle of the pulse train output by the oscillator OSC 42.

Returning to FIG. 5, it is noted that the same configuration could be used to drive a MOSFET switch 20 in place of the bipolar transistor switch 20 which is schematically illustrated in FIG. 5. However, if the system of FIG. 5 is implemented with a MOSFET as switch 20, the gate driver 10 must be implemented accordingly, so as to provide an output signal $V_D$ adapted to produce the desired behavior of MOSFET switch 20.

Figure 7:
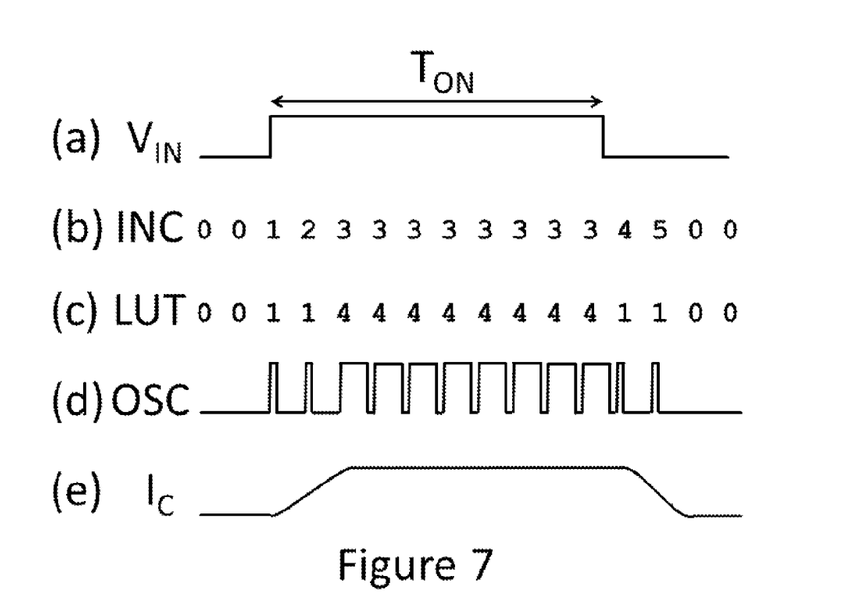
FIG. 7 is a timing diagram corresponding to a system similar to the one shown in FIG. 5, wherein the switch is a MOSFET instead of a bipolar transistor; this diagram illustrates the operation of turning the MOSFET on and off.

FIG. 7 shows a timing diagram illustrating how a MOSFET switch 20 can be driven by the system shown in FIG. 5, in order to achieve a desired slew rate. The parameters used in this example have been selected only for illustrative purposes, and are in no way to be understood as limiting.

In this example, adaptive incrementer INC 46 increments up to 3, as a steady-state operation is reached after the first two pulses, and then repeats this output value for the duration of $T_{ON}$. Furthermore, according to this example, when the control input signal $V_{IN}$ goes low, the adaptive incrementer INC 46 increments for a further two values, to allow a turn-off slew rate to be defined for switch 20. The behavior of the adaptive incrementer INC 46 is summarized in Table 5, below.

TABLE 5

Values of INC for example illustrated in FIG. 7

| Clock pulse interval | 0 | 1 | 2 | 3 | 4 ... | n | n + 1 | n + 2 | n + 3 |
|---|---|---|---|---|---|---|---|---|---|
| $V_{IN}$ | 0 | 1 | 1 | 1 | 1 | 1 | 0 | 0 | 0 |
| INC | 0 | 1 | 2 | 3 | 3 | 3 | 4 | 5 | 0 |

Taking switch 20 to be a 300V/90A N-MOSFET with a threshold voltage $V_{TH}$=2.5V, two "short" pulses with LUT=1 are required to prebias the MOSFET to a very small current $I_C$. The look-up table LUT 48 of this example has five values, which are summarized below in Table 6, so as to define two start-up period duty cycles, a steady-state duty cycle, and two turn-off period duty cycles.

TABLE 6

Look-up table LUT 48 for example illustrated in FIG. 7

| LUT input | 1 | 2 | 3 | 4 | 5 |
|---|---|---|---|---|---|
| LUT output | 1 | 1 | 4 | 1 | 1 |

The oscillator OSC of this example functions as shown above in Table 3, i.e., an input value of 1 corresponds to a duty cycle $D_{GD}$=20% of oscillator OSC 42, and an input value of 4 corresponds to $D_{GD}$=80% of oscillator OSC 42.

As in the previous example, control signal $V_{IN}$ is held high for a period of 4 µs, which is denoted $T_{ON}$ in FIG. 7(a). Furthermore, the clock frequency is 100 kHz, which leads to the number of pulses in the pulse train being 24. (Note: to simplify the drawing, the middle pulses are not shown!) Finally, $V_{CC}$ is 12V and inductor $L_1$ has an inductance of 1 µH.

As shown in FIG. 7(b), at the start of $T_{ON}$, the adaptive incrementer INC 46 increments up to 3, and then repeats this value until the end of $T_{ON}$. Finally, the adaptive incrementer INC 46 increments for a further two oscillation periods before returning to 0. The output values of the adaptive incrementer INC 46 are matched by the look-up table LUT 48, as shown in FIG. 7(c), to produce the duty cycles of oscillator OSC 42 shown in FIG. 7(d). The slope of the current $I_C$ shown in FIG. 7(e) represents the slew rate of the switch 20. Different starting pulses of $D_{GD}$=40%, 60% or 80% could be selected so as to adjust the slew rate, also referred to as the drain current rise time, of MOSFET 20.

The duty cycle of the pulse train shown in FIG. 6(d) or FIG. 7(d) can also be adjusted so as to achieve a defined drain voltage rise time, gate current, or gate voltage rise time of switch 20.

Figure 8:
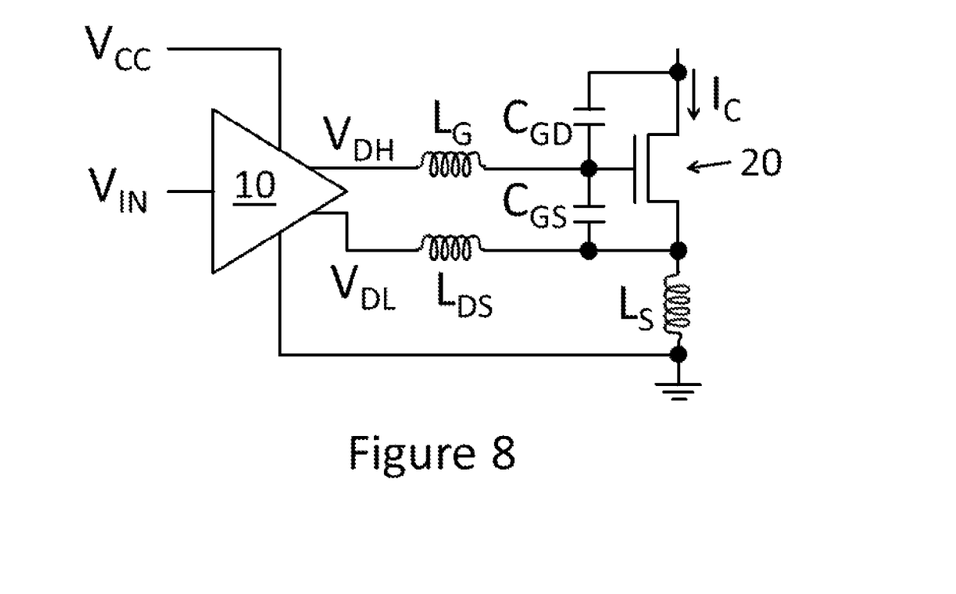
FIG. 8 is a schematic diagram illustrating a modification of the system shown in FIG. 1.

As shown in FIG. 8, an alternative embodiment of the system for switching a high power load described with respect to FIG. 1 includes a gate driver 10 with a differential output $V_{DH}$, $V_{DD}$. Such a differential output can be used to steer the current needed to charge or discharge the gate of switch 20, independently of parasitic inductances in the power path, or other factors affecting the switching speed, to achieve a more controlled switching cycle. FIG. 8 illustrates various parasitic effects, including parasitic gate inductance $L_G$, parasitic gate-drain capacitance $C_{GD}$, parasitic gate-source capacitance $C_{GS}$, parasitic drain-source inductance $L_{DS}$, and parasitic source inductance $L_S$.

Although FIG. 8 shows a differential gate driver with one supply voltage $V_{CC}$, an alternative embodiment of a differential gate driver with a bipolar supply (i.e., comprising a positive terminal V+ and a negative terminal V−) would also be possible.

Figure 9:
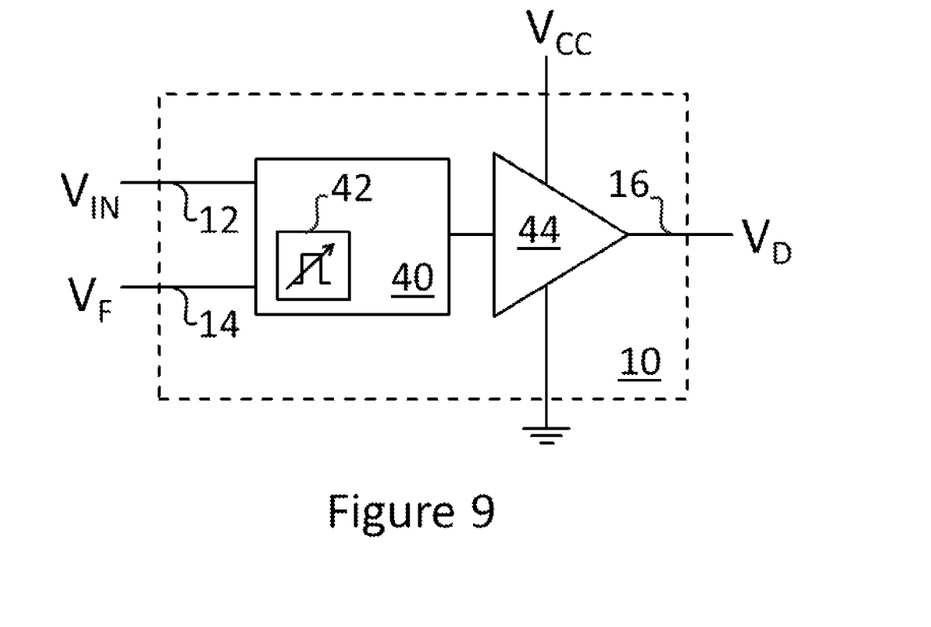
FIG. 9 is a schematic diagram of a gate driver according to a second embodiment.

A second embodiment of gate driver 10 is shown in FIG. 9. Like the gate driver of the first embodiment, the gate driver 10 of FIG. 9 includes a control input 12 which receives a control signal $V_{IN}$ and feeds it to a controller 40 with an adaptive pulse generator 42. As in the first embodiment, gate driver 10 further includes an amplifier 44 and an output 16 which provides an amplified output signal $V_D$. The gate driver 10 of the second embodiment further includes a feedback input 14 which receives a feedback signal 70 and feeds it to the controller 40.

Providing such a feedback signal 70 allows the gate driver 10 to produce the adaptive pulse train 52 with a variable pulse width which is determined by external factors, such as temperature, output current, or drain/collector voltage of switch 20. Varying the pulse width therefore enables adaptive control of the current flowing through the gate of the switch 20.

According to one aspect of the second embodiment, the switch 20 may be a bipolar junction transistor (BJT), such as a SiC bipolar transistor made by TranSiC, or any other bipolar transistor from another manufacturer. The root-mean-square (RMS) output current of the switch 20 can be provided as feedback signal 70, in response to which the adaptive pulse train of output signal $V_D$ is varied, in order implement proportional drive and/or saturation control of the BJT.

Furthermore, according to the second embodiment, inductances which are present in the gate drive loop can be used to control and shape the current flowing through the gate of the switch 20. Parasitic inductances caused by the layout of gate driver components and/or parasitic inductances in the emitter or source path of the switch can be taken into consideration for determining the pulse width of output signal $V_D$, so that the output signal $V_D$ can provide accurate control of the current flowing through switch 20.

In the embodiment shown in FIG. 9, control signal $V_{IN}$ preferably indicates whether switch 20 is to be held in an ON state or in an OFF state and/or a desired slew rate of switch 20, while feedback signal 70 represents some parameter related to the operation of switch 20, such as a load current $I_C$ through the switch 20, a sensed slew rate of the switch 20, a voltage across two terminals of the switch 20, a voltage across the gate and one terminal of the switch 20, or a temperature of the switch 20.

Figure 10:
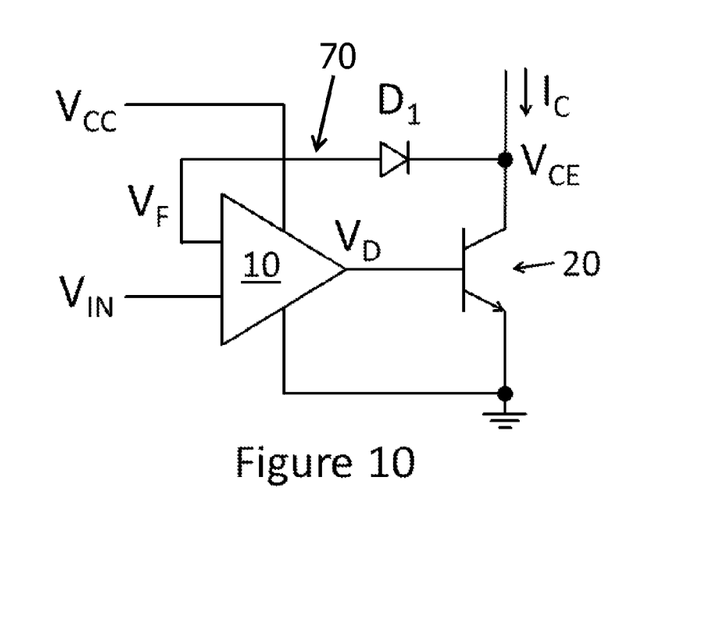
FIG. 10 is a schematic of an alternative system for switching a high-power load comprising the gate driver according to the second embodiment.

FIG. 10 shows one possible system comprising gate driver 10 according to the second embodiment, in which the feedback signal 70 is provided by connecting first terminal $V_{CE}$ of switch 20 via a diode $D_1$ to the feedback input 14 of gate driver 10. Operation of this system to implement proportional drive is shown in FIG. 11.

Figure 11:
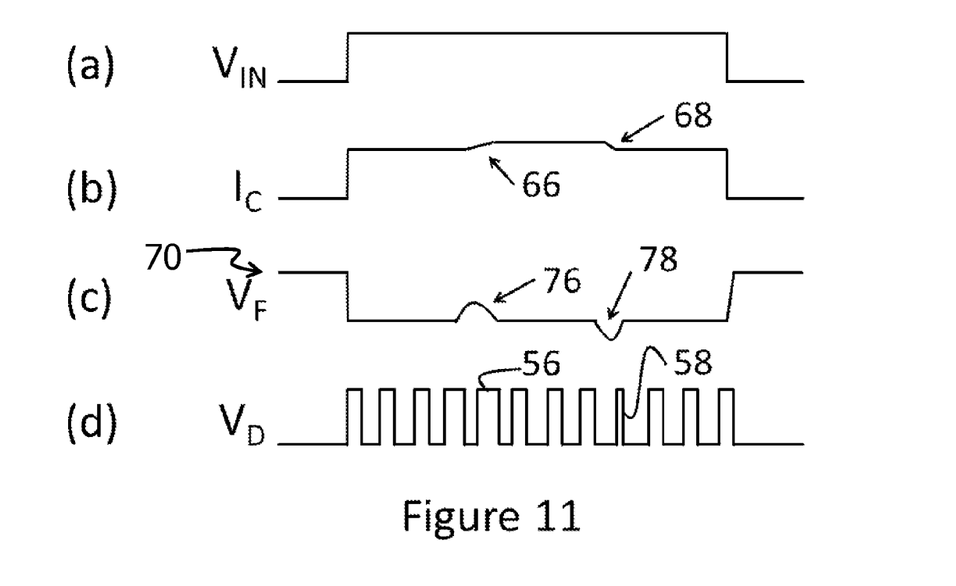
FIG. 11 is a timing diagram which illustrates one function which may be implemented by the gate driver according to the second embodiment.

As shown in FIG. 11(a), when control signal $V_{IN}$ is low, switch 20 is off and output signal $V_D$ is also held low. In particular, the switch 20 may be a bipolar transistor (BJT). According to this embodiment, when the switch 20 is to be turned on, control signal $V_{IN}$ goes high. This causes load current $I_C$ to flow through switch 20, as shown in FIG. 11(b). In case of an undesired current increase 66, feedback signal $V_F$, shown in FIG. 11(c), indicates an increased collector voltage 76. This causes the gate driver 10 to produce wider pulses 56, as shown in FIG. 11(d), so as to stabilize the load current $I_C$. Correspondingly, any decrease in the collector current 68 results in a decreased collector voltage 78, which is compensated by the gate driver 10 producing narrower pulses 58 so as to stabilize load current $I_C$. In this way, proportional drive of switch 20 can be implemented, improving efficiency and robustness of the system.

Figure 12:
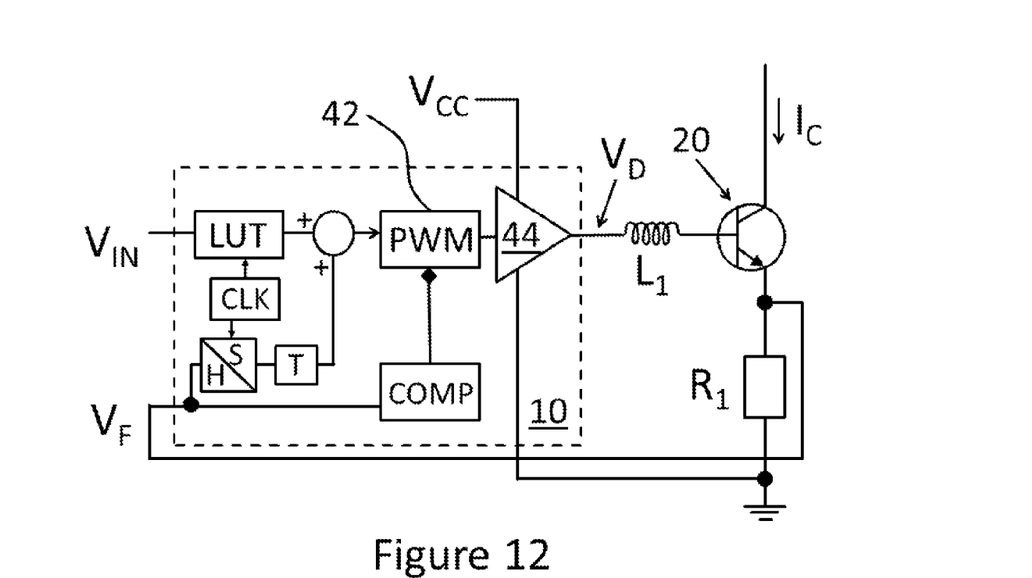
FIG. 12 is a schematic diagram of another possible implementation of a system comprising the gate driver according to the second embodiment and a bipolar transistor as a switch.

FIG. 12 shows another possible system comprising a gate driver 10 according to the second embodiment. This system comprises a current sense resistor $R_1$ connected between the second terminal of switch 20 and ground. The voltage over the current sense resistor $R_1$ is provided as feedback voltage $V_F$ to gate driver 10. This allows the gate driver 10 to easily determine the current $I_C$ through switch 20 as a function of the feedback voltage $V_F$ and the value of the current sense resistor $R_1$.

The gate driver 10 shown in FIG. 12 shows one possible implementation of gate driver 10 according to the second embodiment. According to this implementation, the controller 40 comprises a look-up table LUT, a clock CLK, a sample-and-hold unit S/H, an adder, a comparator COMP, and a pulse-width modulator PWM. The controller 40 may, optionally, further comprise a sense amplifier T. These components may be provided as analog circuit components; alternatively, the controller 40 may be implemented in digital logic (for example, as a microprocessor), and may digitalize input signals $V_{IN}$ and $V_F$ before processing these signals in functional blocks corresponding to the components shown in FIG. 12.

According to this implementation, control signal $V_{IN}$ is fed to the look-up table LUT, which produces output values at intervals determined by the clock CLK. The clock CLK is also used as a timing input for the sample-and-hold block S/H, which samples the feedback voltage $V_F$ at intervals determined by clock CLK.

The output of sample-and-hold unit S/H may optionally be fed to the sense amplifier T, which applies a predefined gain to the sampled feedback voltage $V_F$. The output of sense amplifier T is added to the signal produced by the look-up table LUT to form the input to pulse-width modulator PWM. In case the required gain of the sampled feedback voltage $V_F$ is equal to 1, the sense amplifier T may be omitted.

In the implementation of gate driver 10 shown in FIG. 12, the feedback voltage $V_F$ is also fed to a comparator COMP, which is used to disable PWM generation when the voltage across the sense resistor $R_1$ exceeds a certain threshold. Accordingly, the output of comparator COMP is provided as a control signal to pulse-width modulator PWM 42. In alternative embodiments, the PWM may be implemented as another type of adaptive pulse generator, such as a voltage-controlled oscillator.

Finally, the output of PWM 42 is fed to amplifier 44. Operation of this system to implement a changing pulse width in response to overcurrent is shown in FIG. 13.

Figure 13:
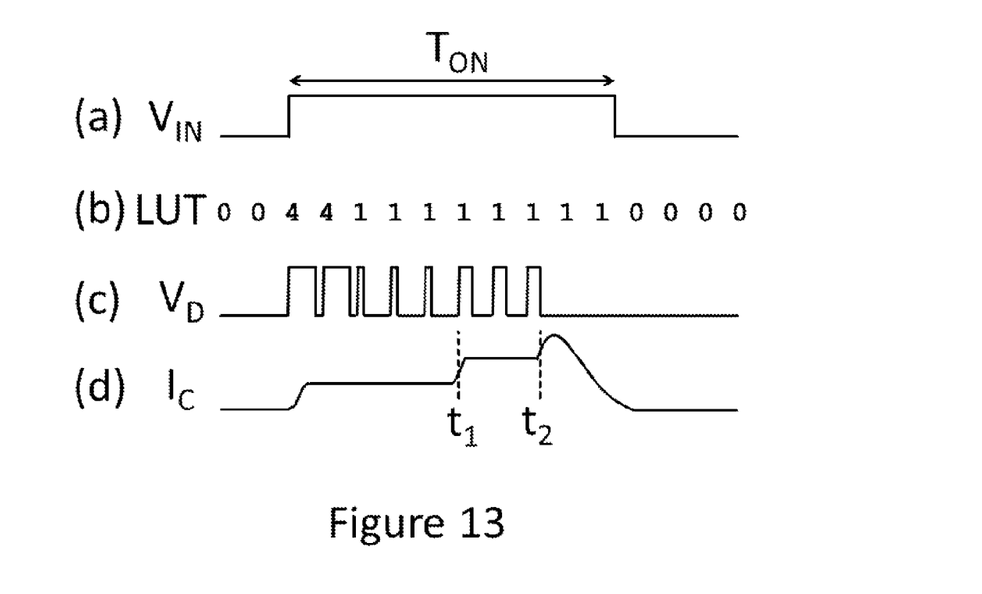
FIG. 13 is a timing diagram corresponding to the system shown in FIG. 12, which illustrates another function which may be implemented by the gate driver according to the second embodiment.

As shown in FIG. 13(a), control signal $V_{IN}$ is held high for a period denoted as $T_{ON}$. In response, the look-up table LUT generates values shown in FIG. 13(b) at intervals determined by CLK. Based on the values generated by look-up table LUT, gate controller 10 generates a pulsed output signal $V_D$, as shown in FIG. 13(c), so as to turn on switch 20 with a desired slew rate, as previously demonstrated in the timing diagram of FIG. 6.

Initially, i.e. at the start of period $T_{ON}$ before time $t_1$, the collector current $I_C$ flowing through switch 20 is maintained at a constant level, as shown in FIG. 13(d). During this time, the switch 20 may be fully on (i.e., operating at saturation), or switch 20 may be driven proportionally, for example at a level corresponding to the amplitude of control signal $V_{IN}$.

At time $t_1$, the collector current $I_C$ increases as shown in FIG. 13(d), due to an external effect such as a short circuit developing through load 30. The collector current increase is sensed via sample-and-hold unit S/H, and (optionally) amplified by sense amplifier T, before being additively fed as an input to pulse-width modulator PWM. The pulse-width modulator PWM responds by increasing the duty cycle of its output pulses, thereby increasing the duty cycle of output signal $V_D$. This causes the base current of switch 20 to increase, in an attempt to bring the collector current $I_C$ back down to the desired level.

At time $t_2$, another external effect (such as further development of short circuit through load 30) causes the collector current $I_C$ to increase further, as shown in FIG. 13(d), and to reach an unsafe value. This is sensed via feedback voltage $V_F$, and the comparator COMP immediately disables pulse-width modulator PWM, so that the output signal $V_D$ of gate driver 10 is pulled low and switch 20 is turned off. Although the look-up table LUT continues to produce positive values for the remainder of period $T_{ON}$, the gate driver 10 remains disabled by comparator COMP so that switch 20 remains off. In this way, the gate driver 10 is adapted to safely turn off the switch 20 in case of overcurrent.

According to any of the above embodiments, the slew rate of the switch 20 can be controlled by the amplitude of control signal $V_{IN}$ or by a digitally encoded command which forms part of the control signal $V_{IN}$. In case of a digitally encoded slew rate, the control signal $V_{IN}$ can be fed to the controller 40, which decodes the signal and controls the adaptive pulse generator 42 accordingly so as to generate the desired slew rate.

Similarly, in the second embodiment, proportional drive of the switch 20 can be controlled by the amplitude of control signal $V_{IN}$ or by a digitally encoded command which forms part of the control signal $V_{IN}$, in response to the value of feedback signal 70. In case of a digitally encoded proportional drive signal, the control signal $V_{IN}$ can be fed to the controller 40, which decodes the signal and controls the adaptive pulse generator 42 accordingly so as to drive switch 20 at the desired level.

It will be appreciated that various modifications may be made to the embodiments described herein without departing from the claimed subject-matter.

LIST OF REFERENCE NUMERALS 10 gate driver
12 control input
14 feedback input
16 output
20 switch
30 load
40 controller
42 adaptive pulse generator
44 amplifier
45 clock
46 adaptive incrementer
48 look-up table
49 D/A converter
50 square wave
52 pulse train
54 pulses
56 wider pulses
58 narrower pulses
66 increasing collector current
68 decreasing collector current
70 feedback control signal
76 increased collector voltage
78 decreased collector voltage

The invention claimed is:

1. A gate driver for driving a gate of a switch, the gate driver comprising:
a control input which is adapted to receive a control signal;
an output which is adapted to provide an amplified output signal to be fed to the gate of the switch for driving the switch; and
a controller comprising an adaptive incrementer and a look-up table,
wherein the controller is connected between the control input and the output, and is adapted to produce an adaptive pulse train that varies depending on a characteristic of the control signal,
wherein the adaptive incrementer is adapted to produce a sequence of numbers, the values of which allow a slew rate of the switch to be set, and
wherein the look-up table is adapted to be fed with the sequence of numbers, and to associate the numbers produced by the adaptive incrementer with values representing the duty cycle of the output signal so as to control the slew rate of the switch.

2. The gate driver of claim 1, wherein the controller is adapted to vary the adaptive pulse train according to the characteristic of the control signal so as to adjust a slew rate of the switch.

3. The gate driver of claim 1, further comprising a feedback input which is adapted to receive a feedback signal, wherein the controller is further adapted to receive the feedback signal and to vary the adaptive pulse train depending at least in part on a characteristic of the feedback signal.

4. The gate driver of claim 3, wherein the controller is adapted to vary the adaptive pulse train according to a characteristic of the feedback signal so as to control saturation of the switch or so as to enable proportional drive of the switch.

5. The gate driver of claim 3, wherein the feedback signal represents a temperature of the switch, and wherein the controller is adapted to vary the adaptive pulse train according to the temperature of the switch so as to turn off the switch in case of overcurrent.

6. The gate driver of claim 1, wherein the controller is adapted to vary the adaptive pulse train by adapting the duty cycle of the pulse train.

7. The gate driver of claim 1, wherein the controller is adapted to vary the adaptive pulse train by adapting a number of pulses in the pulse train.

8. The gate driver of claim 1, wherein the controller comprises an adaptive pulse generator.

9. The gate driver of claim 8, further comprising an amplifier.

10. The gate driver of claim 9, wherein the controller is adapted to produce a non-amplified pulse train, and the amplifier is adapted to receive the non-amplified pulse train and to produce the amplified output signal.

11. The gate driver of claim 9, wherein the amplifier is adapted to produce an amplified signal, and the controller is adapted to receive the amplified signal and to produce the adaptive pulse train which forms the amplified output signal.

12. A system for switching a high-power load, comprising:
a switch, which comprises a gate, a first terminal connected to the high-power load, and a second terminal; and
a gate driver for driving the gate of the switch, the gate driver comprising:
a control input which is adapted to receive a control signal;

an output which is adapted to provide an amplified output signal to the gate of the switch for driving the switch; and a controller comprising an adaptive incrementer and a look-up table, wherein the controller is connected between the control input and the output, and is adapted to produce an adaptive pulse train that varies depending on a characteristic of the control signal, wherein the adaptive incrementer is adapted to produce a sequence of numbers, the values of which allow a slew rate of the switch to be set, and wherein the look-up table is adapted to be fed with the sequence of numbers, and to associate the numbers produced by the adaptive incrementer with values representing the duty cycle of the output signal so as to control the slew rate of the switch.

13. The system according to claim 12, wherein the gate driver further comprises a feedback input which is adapted to receive a feedback signal, and wherein the controller is further adapted to receive the feedback signal and to vary the adaptive pulse train depending at least in part on a characteristic of the feedback signal.

14. The system according to claim 13, wherein the switch is adapted to conduct a gate current from the first terminal to the second terminal in response to the output signal of the gate driver, and wherein the feedback signal represents the gate current of the switch.

15. The system according to claim 14, further comprising a current sensor adapted to provide a measurement of the gate current of the switch as the feedback signal.

16. The system according to claim 13, wherein the feedback signal represents a temperature of the switch.

17. The system according to claim 16, further comprising a temperature sensor adapted to provide a measurement of temperature of the switch as the feedback signal.

18. The system according to claim 13, wherein the feedback signal represents a voltage at the second terminal of the switch.

19. The system according to claim 13, wherein the feedback signal represents a voltage at the gate of the switch.

20. The system according to claim 13, wherein the feedback signal is calculated as a ratio of a voltage at the first terminal to a voltage at the second terminal of the switch.

21. The system according to claim 12, wherein the switch is MOSFET, an IGBT, a BJT, an SCR or thyristor, a GTO, or an IGCT.

* * * * *